United States Patent [19]

Iwai

[11] Patent Number: 4,532,696

[45] Date of Patent: Aug. 6, 1985

[54] METHOD OF MANUFACTURING A SEMICONDUCTOR DEVICE FOR FORMING A DEEP FIELD REGION IN A SEMICONDUCTOR SUBSTRATE

[75] Inventor: Hiroshi Iwai, Tokyo, Japan

[73] Assignee: Tokyo Shibaura Denki Kabushiki Kaisha, Japan

[21] Appl. No.: 475,944

[22] Filed: Mar. 16, 1983

[30] Foreign Application Priority Data

Mar. 26, 1982 [JP] Japan .................................. 57-48573

[51] Int. Cl.³ .................. H01L 21/283; H01L 21/265
[52] U.S. Cl. .................................. 29/571; 29/576 W; 29/580; 29/591
[58] Field of Search ............ 148/187; 29/571, 576 W, 29/580, 591

[56] References Cited

U.S. PATENT DOCUMENTS

| 4,391,033 | 7/1983 | Shinozaki | 29/576 W |
| 4,394,196 | 7/1983 | Iwai | 29/571 |
| 4,415,371 | 11/1983 | Soclof | 148/187 |
| 4,419,813 | 12/1983 | Iwai | 148/187 X |
| 4,445,967 | 5/1984 | Kameyama | 148/187 X |

Primary Examiner—George T. Ozaki
Attorney, Agent, or Firm—Finnegan, Henderson, Farabow, Garrett & Dunner

[57] ABSTRACT

This invention provides a method of forming a buried element isolation region in a semiconductor substrate. The method comprises steps of forming a gate electrode material pattern on a gate insulating film formed on a semiconductive substrate, forming a gate electrode by selectively forming a groove in said gate electrode material pattern to thereby isolate said pattern and burying insulating material in the groove.

25 Claims, 58 Drawing Figures

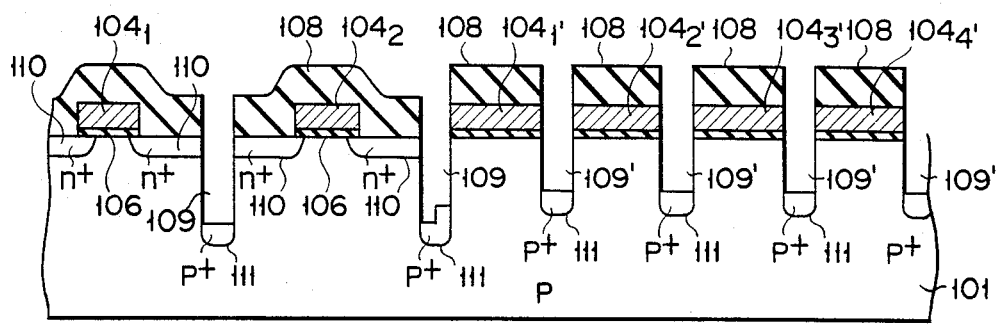
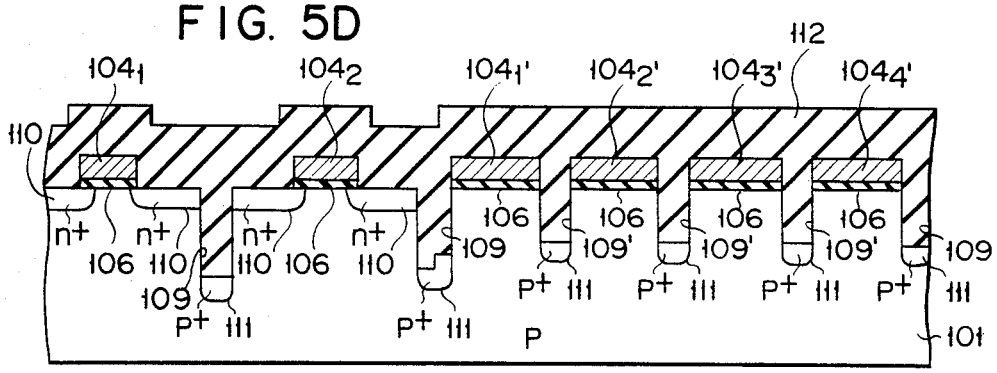
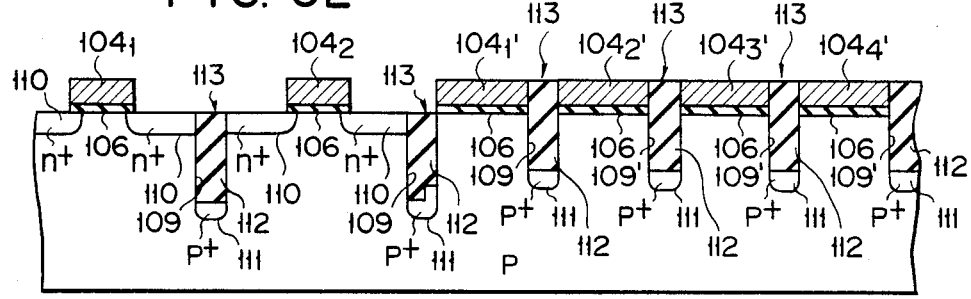
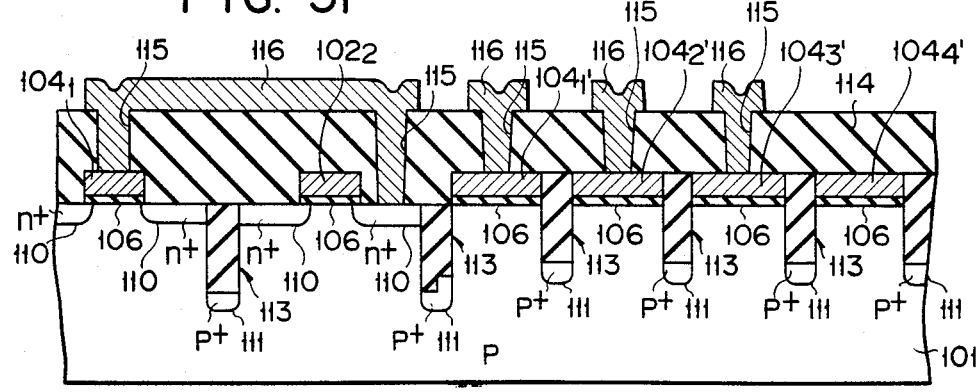

METHOD OF MANUFACTURING A SEMICONDUCTOR DEVICE FOR FORMING A DEEP FIELD REGION IN A SEMICONDUCTOR SUBSTRATE

BACKGROUND OF THE INVENTION

The present invention relates to a method of manufacturing a semiconductor device and, more particularly, to an improvement in isolating elements of a MOSLSI (Metal Oxide Semiconductor Large Scale Integrated Circuit).

Heretofore, a selective oxidation method has been in general employed as an interelement isolating method in the step of manufacturing a semiconductor device and particularly an MOSLSI. This method will be described in more detail using an n-channel MOSLSI as an example.

As shown in FIG. 1(A), an $SiO_2$ film 2 is first grown by thermal oxidation on a p-type Si substrate 1 having a crystal plane (100), and an $Si_3N_4$ film 3 is accumulated on the film 2. Subsequently, a resist film 4 is formed by a photoetching method on an element forming portion. With the film 4 as a mask, the film 3 except the element forming portion is etched and removed, and an $Si_3N_4$ pattern 3' is formed. Then, a boron ion implantation is, for example, performed, thereby forming a $p^+$type region 5 as a channel stopper region in the field region (FIG. 1(B)). After the film 4 is removed, a wet oxidation is carried out with the pattern 3' being employed as a mask, and a thick field oxidized film (field region) 6 is selectively grown (FIG. 1 (C)). Subsequently, the pattern 3' and the film 2 are etched and removed, thereby forming an element forming region 7 isolated between field regions 6 (FIG. 1(D)). Thereafter, as shown in FIG. 1(E), a gate electrode 9 formed of a polycrystalline silicon is formed through a gate oxidized film 8 on the region 7, and arsenic is, for example, diffused in the region 7 to form n+ regions 10 and 11 as a source and a drain. A $CVD$-$SiO_2$ film 12 are eventually accumulated as an interlayer insulating film on the overall surface. Contacting holes 13 are opened at the portions corresponding to the regions 10 and 11, and the gate electrode 9 over the film 8, and aluminum wires 14 are formed in film 12, thereby manufacturing an n-channel MOSLSI (FIG. 1(F)).

The above-described conventional selective oxidation method of manufacturing the MOSLSI, however, has various drawbacks as described below.

FIG. 2 shows in detail a sectional structure of the MOSLSI in which the field region 6 is formed with the pattern 3' shown in FIG. 1(C) as a mask. It is in general known that the region 6 intrudes into the region under the pattern 3' when growing by the selective oxidation method (a region F in FIG. 2). In this case, the region F consists of a portion D or a so-called "bird's beak" where an oxidizer is diffused through the thin film 2 under the pattern 3' during the field oxidation, and a portion E where the thick part of the region 6 is laterally intruded. When the region 6 is 1 μm in thickness for example, and is grown under the conditions that the thickness of the pattern 3' is 1,000 Å and the film 2 under the pattern 3' is 1,000 Å thick, the length of the portion F reaches approximately 1 μm. It is assumed that a distance A between the patterns 3' is 2 μm. Then, the width C of the field region cannot be reduced to less than 4 μm, since the width of the portion F is 1 μm, resulting in a large obstruction in the integration of an LSI. Thus, a method of suppressing a bird's beak (the portion D in FIG. 2) by reducing the thickness of the film 2 under the pattern 3' use of a thick pattern 3' and a method of suppressing the intruded portion F of the field by reducing the thickness of the grown film of the field 6 have been recently proposed. However, the former causes a large stress at the end of the field, resulting in the ready production of defects, and the latter has a problem of a decrease in the inverted voltage of the field. In this manner, there is a limit to the integration of an LSI by the conventional selective oxidation method.

When a channel stopper is provided, boron ions implanted as the channel stopper diffuses laterally during a field oxidation. As shown in FIG. 3(A), part of the region 7 becomes the region 5, and the effective element region is narrowed from the width G to the width H. As a result, a narrow channel effect such as a reduction in the current of a transistor or an increase in the threshold voltage occurs when microminiaturization of an element is carried out. Since the region 5 extends further laterally, a junction between the region 11 (or 10) and the region (5) in the region 7 becomes wide as shown in FIG. 3(B), resulting in an increase in the floating capacitance between the regions 10, 11 and the substrate 1. This capacitance cannot be ignored as the element is reduced.

Further, the conventional element isolating method has the following drawbacks.

As shown in FIG. 4(A), since the region 6 and the electrode 9 are not self-aligned, it is necessary to provide an alignment margin portion 15 in the region 6 to enable the electrode 9 to extend into the region 6. This structure obstructs the integration of the LSI. More particularly, as shown in FIG. 4(B), it is necessary to form a spacing I (which depends upon the minimum size of a photoetching method) between gate electrodes $9_1$ and $9_2$, in addition to margins J and K of the portions $15_1$ and $15_2$, so that different electrodes $9_1$ and $9_2$ face each other on the region 6. It is assumed that the relationship of the lengths of the margins J and K and the spacing I is $J=K=I=1$ μm. Then, the minimum width M of the region 6 in this portion should become 3 μm. Thus, it is impossible to form the field region having a width less than this length.

SUMMARY OF THE INVENTION

The present invention has been made to eliminate the above-described drawbacks and disadvantages and has for its object to provide a method of manufacturing a semiconductor device which is capable of high integration and high performance by using a novel element isolating system.

According to an aspect of the present invention, there is provided a method of manufacturing a semiconductor device which comprises the steps of forming a gate electrode material pattern on a gate insulating film deposited on a conductive type semiconductor substrate, forming a gate electrode by selectively forming a groove on the gate electrode material pattern and isolating the pattern, and burying an insulating material in the groove.

In the step of forming the gate electrode material pattern, the same gate electrode as the conventional electrode may be simultaneously and partially formed directly on the semiconductor substrate.

The gate insulating film employed in this method includes, for example, an $SiO_2$ film, a two-layer film of the $SiO_2$ film and an $Si_3N_4$ film, and a two-layer film of the SiO$_2$ film and an Al$_2$O$_3$ film. The gate electrode material includes, for example, a polycrystalline silicon, an impurity-doped polycrystalline silicon, metal such as aluminum, molybdenum, tungsten or tantalum, or metal silicide such as molybdenum silicide, tungsten silicide or tantalum silicide.

Then, with the gate electrode material pattern (and the gate electrode) as a mask, an impurity having reverse or opposite conductive type to the semiconductor substrate is doped with the substrate, thereby forming impurity regions as a source region and a drain region, as required.

Subsequently, a mask material, from which a portion is removed when a groove is to be formed, such as a resist pattern is formed on the semiconductor substrate thus formed with the gate electrode material pattern, the electrode material pattern exposed from the mask material is then partially and selectively etched, thereby forming a groove, the pattern is isolated, and a gate electrode is formed. The formation of this groove is not limited to when the thickness of the pattern is etched. For example, the groove may be formed by etching the gate insulating film under the pattern, or by further etching the surface of the semiconductor substrate under the insulating film. The groove may not only be formed on the pattern, but may be simultaneously formed on the exposed substrate part. When a reactive ion etching method is employed as etching means in this step, a groove having substantially vertical side surfaces may be formed. However, a groove having a tapered or inverted tapered side may be formed by other etching means. The number of the grooves may be one or more, and the depths of the grooves may be variously formed.

Then, with a masking material as a mask, an impurity having the same conductive type as the semiconductor substrate is doped with the substrate under the groove, thereby forming an impurity region. When the groove is formed only by etching of the gate electrode material pattern, an ion implantation method is employed as the doping means. When the groove is formed over the gate electrode material pattern and the gate insulating film or further over the surface layer of the semiconductor substrate, an ion implantation method or a thermal diffusion method may be employed as doping means. When the groove is formed over the surface layer of the semiconductor substrate so that the depth in the substrate is deeper than the depth of the impurity region used as source and drain regions, an impurity region capable of being utilized as a wiring layer or a resistor may be formed by doping a reverse conductive type impurity on the substrate under the groove.

Subsequently, after the removal of the masking material, an insulating material is accumulated on the overall surface of the semiconductor substrate including the gate electrode and the groove in such a manner that the width of the opening of the specific groove is represented by "a" and the inclining angle of the side surface is $\theta$, and the material accumulated in a thickness being larger than $(a \cdot [\cot(\theta/2)])/2$, so that the material is buried to the opening of at least one groove. The material includes, for example, SiO$_2$, Si$_3$N$_4$ or Al$_2$O$_3$, and may include, as required, low melting point insulating materials such as phosphorus silicate glass, boron silicate glass. The insulating material may be buried by dividing the material into a plurality of steps, as will be described later. In this case, it is not necessary to form a thickness to fill completely the groove in the first burying as described above.

The accumulating means of the insulating material includes, for example; a CVD (Chemical Vapor Deposition) method or a PVD method such as a sputtering method. When the grooves are formed also through the gate insulating film and further through the surface layer of the semiconductor substrate prior to the accumulation of the insulating material, the grooves may be at least partly oxidized or nitrided to grow an oxidized film or nitrided film which does not block the groove. The doping of the impurity at this time may be before or after the oxidizing or nitriding. When such methods are employed together, the field region thus obtained has an oxidized or nitrided film which has excellent density in contact with the substrate and the insulating material formed by accumulation, and remarkably improves the element isolating performance as compared with a method which employs only an insulating material. In this case, it is possible to bury a conductive material such as a polycrystalline silicon, metallic silicide or tungsten. After the accumulation of the insulating material, a low melting point substance such as boron, phosphorus or arsenic is doped entirely or partly on the surface layer of the insulating film. The film is then heat-treated to melt the doped layer of the insulating film. Alternatively, a low melting point insulating material, such as boron silicate glass (BSG), phosphorus silicate glass (PSG) or arsenic silicate glass (AsSG), or an organic substance such as polyimide or resist material is accumulated entirely or partly on the insulating film, and then the low melting point insulating film may be melted. By employing such means, when the part corresponding to the groove becomes recessed according to the accumulation of the insulating material, the recess will be buried by the material, thereby flattening the recess. As a result of this, when the entire surface is etched, the insulating material remaining in the groove can be prevented from becoming lower than the level of the opening of the groove.

Subsequently, the insulating film thus accumulated on the substrate is etched and removed without the masking material until the gate electrode, except for the groove (or the surface of the substrate), is exposed, thereby forming a field region in which the insulating material remains in the groove. The etching step in this process includes, for example, an entire surface etching method which employs an etchant or a plasma etchant or a reactive ion etching method. In this etching step, a partial region of the insulating film is covered with a masking material, and the other film is etched, so that the insulating film remains on all the portion except the groove. Since the insulating material is accumulated after the gate electrode, source and drain regions are formed, the insulating film is not etched, but remains and may be used as an interlayer insulating film.

Then, an interlayer insulating film is accumulated (in some cases, the remainder of the interlayer insulating film is unnecessary without etching the insulating material), contacting holes are opened at the interlayer insulating film on the source and drain regions, and the gate electrode and the metal wires are formed, thereby manufacturing a semiconductor device such as MOSLSI.

However, according to the present invention, at least the gate electrode material pattern is formed through the gate insulating film on the semiconductor substrate. A groove is selectively formed at least through the material pattern to isolate the pattern, thereby forming the gate electrode. The insulating material is then buried in the groove, thereby making possible both the formation of the gate electrode and the field region. Therefore, a semiconductor device which has the various advantages as described below can be obtained.

(1) Since the gate electrode and the field region are self aligned, it is not necessary to provide an alignment margin to allow the gate electrode to extend on the field region, as in the conventional method. Consequently, when the gate electrodes face each other with the field region as the center, it is unnecessary to widen the field region by the amount of the portion of the length corresponding to the alignment margin, and the microminiaturization of the field region, and hence the integration of the semiconductor device, can be performed.

(2) Since the area of the field region is determined by the area of the groove formed in advance on the gate electrode material pattern, the area of the groove is reduced, thereby readily forming the ultrafine field region of the object of the present invention and obtaining a semiconductor device having a high integration.

(3) Since the effective vertical length of the field region is determined by the depth of the groove formed on the substrate, irrespective of the area, the depth is arbitrarily selected, thereby effectively preventing current leakage between elements in the field region, thereby obtaining a semiconductor device having high performance.

(4) After a groove is formed and selectively doped, the high-temperature, long-time thermal oxidation step, such as the conventional selective oxidation, is not employed, so the impurity region rediffuses to the surface of the element formation region, preventing the contraction of the effective field region. Further, it can prevent the impurity from out-diffusing onto the surface of the substrate. In this case, when the doping of the impurity is performed by ion implantation, the impurity ion implantation layer can be formed on the bottom of the groove. Thus, since the ion implantation layer does not extend to the surface layer (the part to be formed with elements) of the region even if the ion implantation layer is rediffused, the contraction of the effective field region can be prevented.

When there is the possibility of a leakage current at the side surface of the field region, $p^+$ type doping may be, for example, performed at the side surfaces of the groove. In this case, when the section of the groove is formed in a V-shaped taper, $p^+$ type doping may be, for example, performed simply at the side surface of the groove by ordinary ion implantation.

Further, an insulating layer such as an $SiO_2$ film connected to the field region remains on the gate electrode at the time of etching the insulating film accumulated on the substrate, and may be used as an interlayer insulating film for multilayer wires.

BRIEF DESCRIPTION OF THE DRAWINGS

The invention can best be understood by reference to the accompanying drawings of which:

FIGS. 5(A) to 5(F) are sectional views showing the steps of manufacturing an MOSLSI in an embodiment of the present invention;

FIGS. 15(A) to 15(E) are sectional views showing the steps up to the formation of the field region in the sixth embodiment of the present invention;

DETAILED DESCRIPTION OF THE PREFERRED EMBODIMENTS

Example 1

This example will describe a method of manufacturing an n-channel MOSLSI according to the present invention.

Figure 5A:
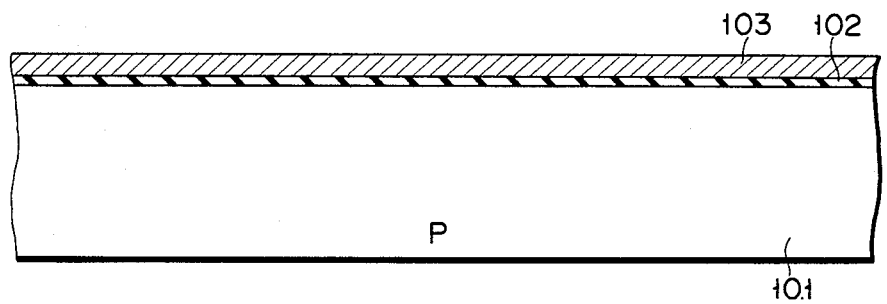
Figure 5B:
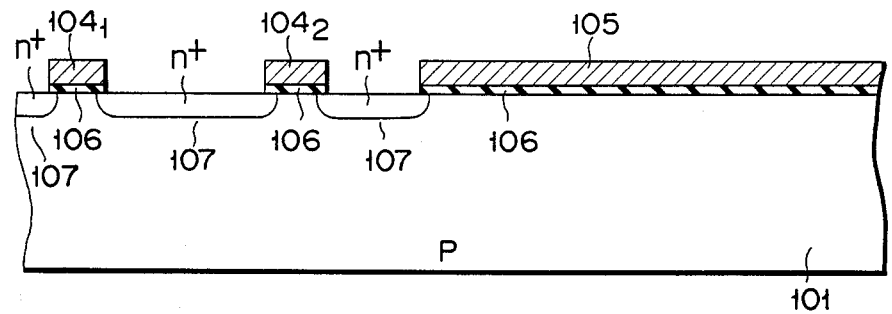
Figure 6:
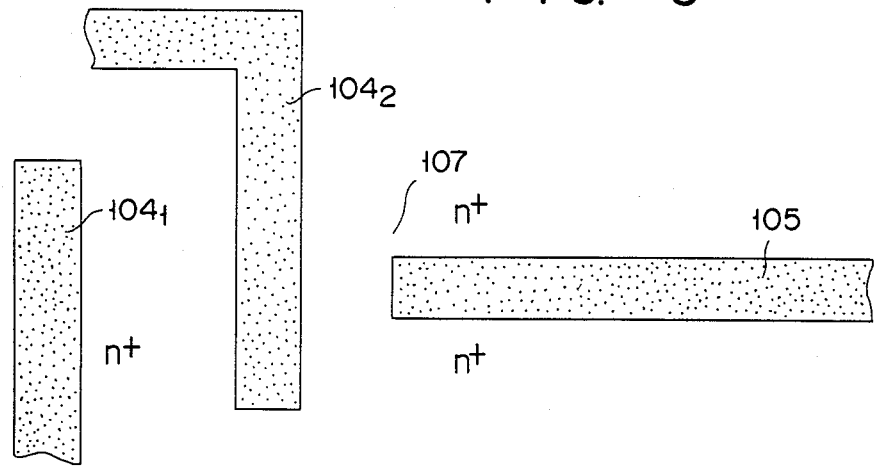
FIG. 6 is a plan view of FIG. 5(B)

(i) A silicon oxidized film 102 was grown by thermal oxidation on a p-type silicon substrate 101 which had a crystalline plane of (100), and an arsenic-doped polycrystalline silicon film 103 was then accumulated on the overall surface (FIG. 5(A)). Subsequently, the film 103 was patterned by a photoetching technique, thereby forming gate electrodes $104_1$, $104_2$ and a polycrystalline silicon pattern 105 as a gate electrode material pattern. With the electrodes $104_1$, $104_2$ and the pattern 105 as masks the film 102 was etched, thereby forming a gate oxidized film 106. Then, with the electrodes $104_1$, $104_2$ as masks an n-type impurity, such as arsenic ions, was implanted, thereby forming $n^+$ type impurity regions 107 to become source and drain regions (FIG. 5(B) and FIG. 5). FIG. 6 is a plan view of FIG. 5(B).

(ii) Then, a resist pattern 108, from which portions to be formed with grooves are removed, was formed on the overall surface. Subsequently, with the pattern 108 as a mask the substrate 101 formed of the regions 107, the pattern 105, the film 106 and the surface layer of the substrate 101 was etched by a reactive ion etching. At this time, as shown in FIG. 5(C), strip grooves 109 each having side surfaces substantially vertical to the substrate 101, and grooves 109' each connected to the grooves 109 were formed over the polycrystalline silicon patterns, gate oxidized films and the surface layer of the substrate 101. The patterns were isolated by the formation of the grooves 109' at the polycrystalline silicon pattern, thereby forming gate electrodes $104_1'$ to $104_4'$. Simultaneously, the regions 107 were isolated, thereby forming n+type source and drain regions 110. Subsequently, with the patterns 108 as masks, p-type impurity ions and hence boron ions were, for example, implanted in the substrate 101 under the grooves 109 and 109', which were then heat treated, thereby forming p+type field inversion preventing region 111 on the bottoms (FIG. 5(C)).

(iii) Subsequently, after the pattern 108 was removed, an $SiO_2$ was accumulated by a CVD method in the grooves 109, 109' to a thickness larger than (a·[cot (θ/2)]/2) (e.g., 0.6 μm), where the width of the openings of the grooves 109, 109' is represented by "a" and the inclining angle of the side surface is represented by θ. The $SiO_2$ was gradually accumulated on the substrate 101, the electrodes $104_1$, $104_2$, $104_1'$ to $104_4'$ and the inner surfaces of the grooves 109, 109' at this time. As shown in FIG. 5(D), a CVD-$SiO_2$ film 112 which filled each of the grooves 109, 109' was formed. Since a thermal oxidation at high temperature for a long time was not performed like the conventional selective oxidation method, the rediffusion of the source and drain regions 110, and the region 111 did not substantially occur.

(iv) Subsequently, the film 112 was entirely etched with an ammonium fluoride until the substrate 101 except the grooves 109, 109' and the electrodes $104_1$, $104_2$, $104_1'$ to $104_4'$ were exposed. At this time, as shown in FIG. 5(E), the film 112 remaining in the grooves 109, 109', was buried in the substrate 101 and the portions of the surface of the substrate 101 between the electrodes $104_1'$ to $104_4'$, thereby forming strip field regions 113 which were connected to each other. Thereafter, an interlayer insulating film 114 was accumulated on the overall surface. After contacting holes 115 were opened at the film 114, an aluminum film was deposited on the overall surface. The electrodes were isolated to form aluminum wires 116 for connecting predetermined source and drain regions 110 to the electrodes $104_1$, $104_2$, $104_1'$ to $104_4'$ through the contacting holes 115, and thereby manufacturing an MOSLSI (FIG. 5(F) and FIG. 7) FIG. 7 is a plan view of FIG. 5(F).

Figure 1A:
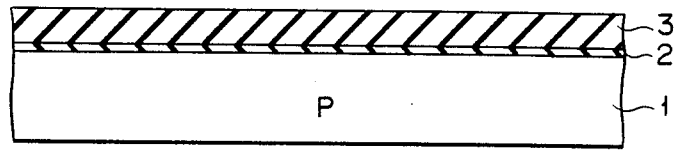
FIGS. 1(A) to 1(F) sre sectional views showing the steps of manufacturing an n-channel MOSLSI employing the conventional selective oxidation method.
Figure 1B:
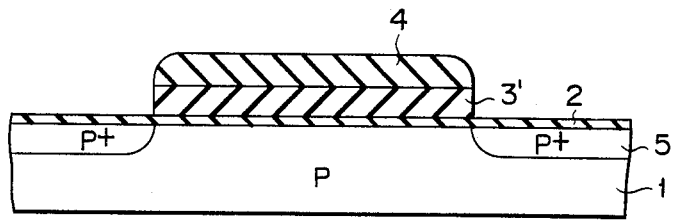
Figure 1C:
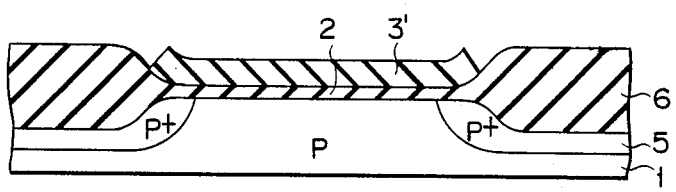
Figure 1D:
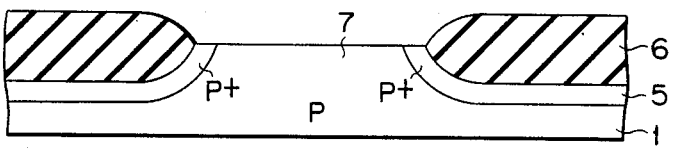
Figure 1E:
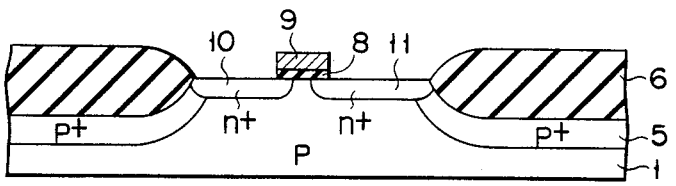
Figure 1F:
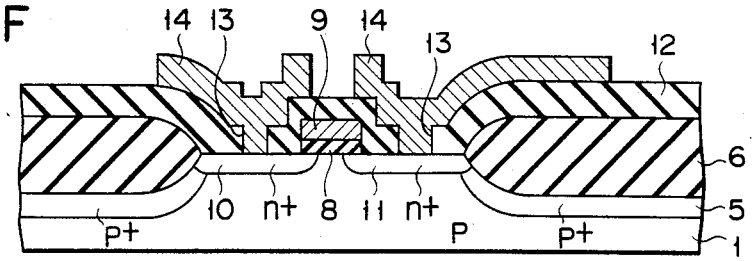
Figure 2:
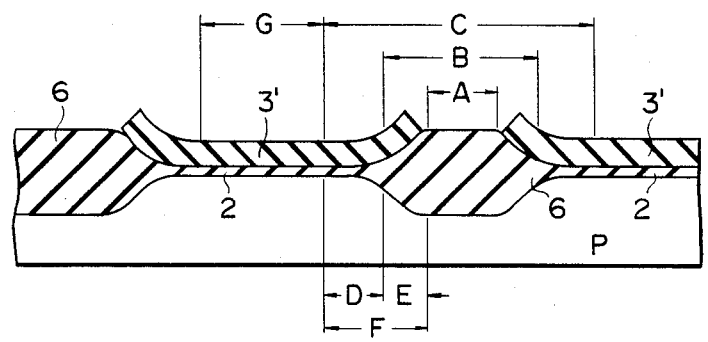
FIG. 2 is an enlarged sectional view showing the state of the semiconductor substrate after the selective oxidizing step.
Figure 3A:
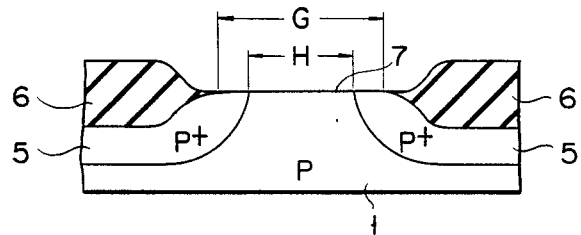
FIGS. 3(A) and 3(B) are sectional views for explaining the problems of the conventional selective oxidation method.
Figure 3B:
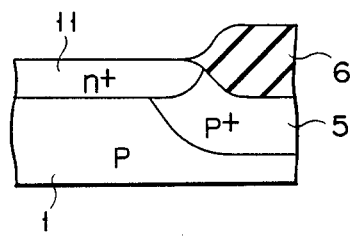
Figure 4A:
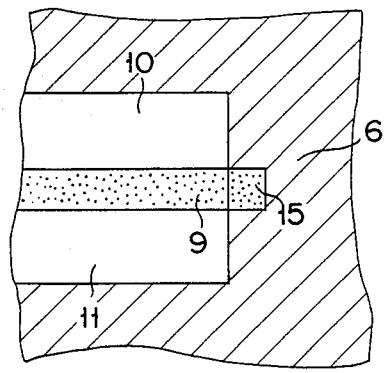
FIGS. 4(A) and 4(B) are plan views for explaining the problems in the conventional selective oxidation method after forming the field region and forming the gate electrode by the selective oxidation method.
Figure 4B:
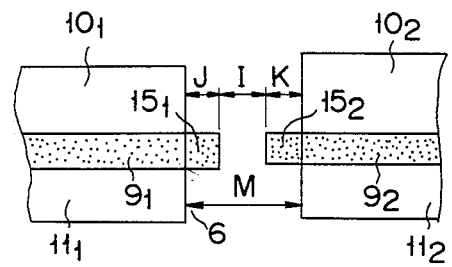
Figure 7:
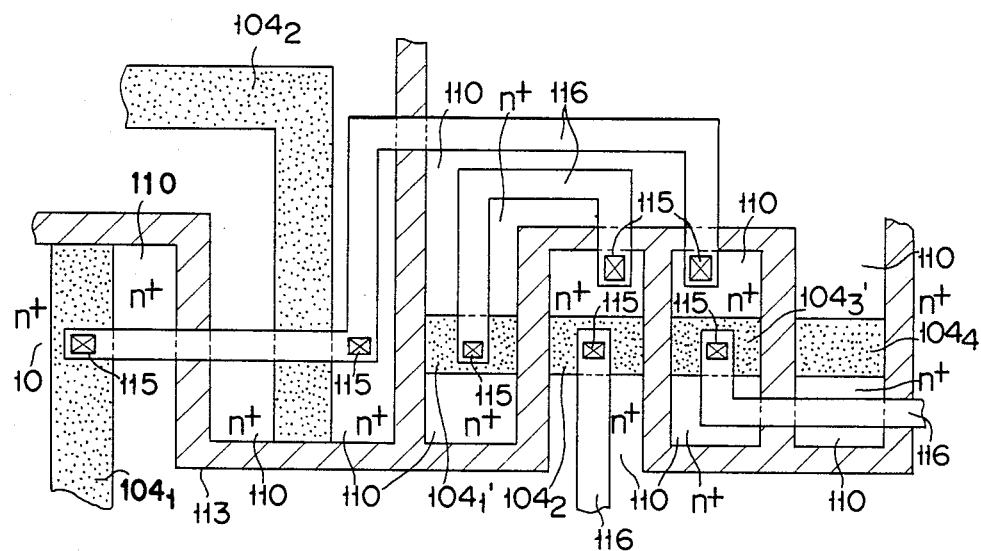
FIG. 7 is a plan view of FIG. 5(F)

Since the electrodes (particularly $104_1'$ to $104_4'$) and the region 113 can be formed self aligned in the MOSLSI thus obtained, in this Example 1, as shown in FIG. 5(F) and FIG. 7, it is not necessary to provide an alignment margin to allow the gate electrode to extend to the field region in the conventional structure as shown in FIG. 4. As a result, when the gate electrodes face each other with the field region as the center (e.g., the electrodes $104_1'$ and $104_2'$), it becomes unnecessary to widen the field region by an amount corresponding to the alignment margin, the microminiaturization of the region 113 can be performed, and an MOSLSI having high density and high integration can be obtained.

Since the width of the region 113 can be determined by the width of the groove 109, the width can be reduced to as little as 1 μm in an ultrafine area, and the area of the region 113 which is in the LSI can be thus contracted.

Since the region 113 is further formed at the same level as the surface of the substrate 101 or at the same level as the surface of the gate electrode without stepwise difference, the stepwise disconnection between the region 113 and the element region can be prevented when forming the wires 116.

Further, since no field oxidizing step, such as in the conventional selective oxidation method, is employed, a defect of the silicon substrate upon production of a stress at the time of growing the oxidized film can be prevented. In addition, the rediffusion of the region 111 can be also prevented.

Figure 8A:
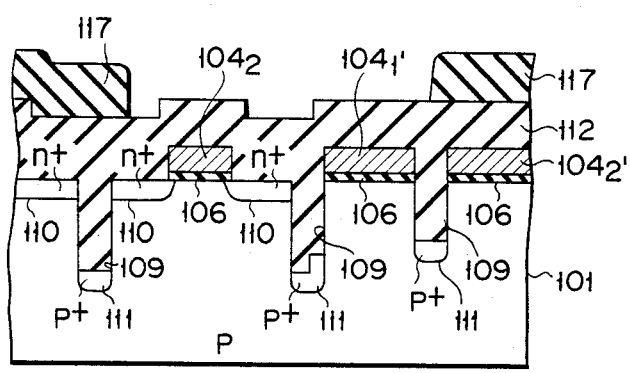
FIGS. 8(A) and 8(B) are sectional views showing the steps up to the formation of a field region, illustrating a modified embodiment of the present invention.
Figure 8B:
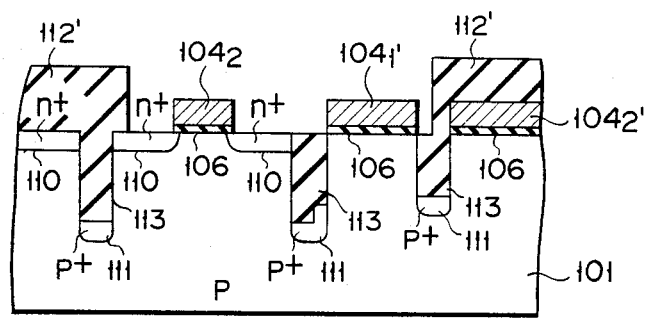

In etching the film 112 in the above Example 1, after a resist pattern 117 is formed on the predetermined part on the film 112 as shown in FIG. 8(A), a CVD-$SiO_2$ film 112' which is connected to the film 112 forming the region 113 may remain by etching the substrate 101 or the electrode $104_2'$ as shown in FIG. 8(B). This film 112' may be utilized as an interlayer insulating film for forming an aluminum wiring layer thereon.

Figure 9:
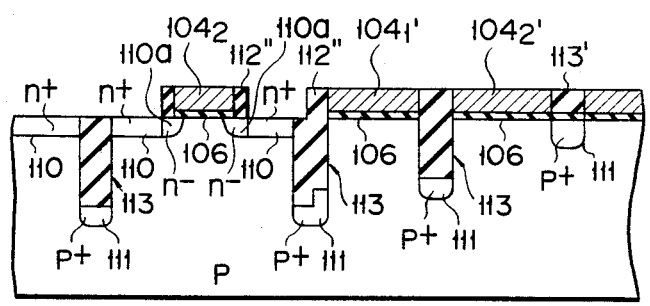
FIG. 9 is a sectional view of the step up to the formation of the field region shown in the modified embodiment of the present invention.

The region 113 is formed and a CVD-$SiO_2$ film 112'' may remain on the side surfaces of the electrodes $104_2$, $104_1'$ as shown in FIG. 9 by etching the entire surface of the CVD-$SiO_2$ film by reactive ion etching instead of employing an ammonium fluoride in etching the film 112 as in the above Example 1. The films 112'' are formed, for example, to form n−type layers 110a on both sides of the electrodes $104_2$. An electric field in the vicinity of the gate electrode may be reduced by reducing the density of the n−type layer in the vicinity of the electrode $104_2$, thereby suppressing a hot electron effect. The method of forming the layer 110a may include the steps of thinly doping an n-type impurity with the source and drain regions with the electrode $104_2$ as a mask before accumulating the film 112 (FIG. 8(A)), forming the films 112'' on both side surfaces of the electrodes $104_2$, and further doping an n-type impurity with the films 112'' and the electrode $104_2$ as masks. The groove for burying the insulating film may be partly and shallowly formed so as to pass only the gate electrode material, as shown at the right side of FIG. 9, and the insulating film may be formed thereon.

Example 2

Figure 10A:
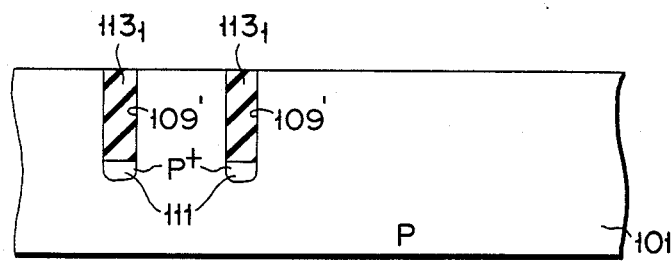
FIGS. 10(A) to 10(C) are sectional views showing the steps up to the formation of the field region in the second embodiment of the present invention.
Figure 10B:
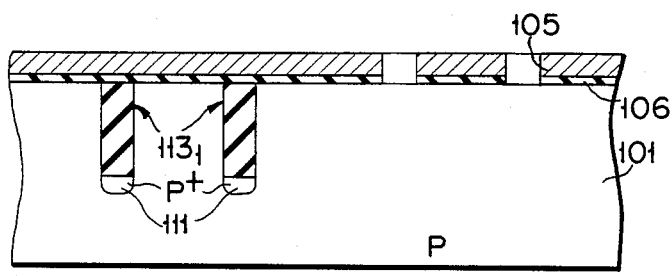

The grooves 109' were first formed in the substrate 101, and CVD-$SiO_2$ was then buried in the grooves 109' in the same method as that in Example 1, thereby forming a first field region $113_1$ (FIG. 10(A)). Subsequently, a thermal oxidation was then performed to grow a silicon oxidized film on the substrate 101. Further, an arsenic-doped polycrystalline silicon film was accumulated, and the polycrystalline silicon film was then patterned by a photoetching technique, thereby forming a polycrystalline silicon pattern 105 as a gate electrode material pattern. Thereafter, with the pattern 105 as a mask the silicon oxidized film was then etched, thereby forming the gate oxidized film 106. Successively, with the pattern 105 as a mask arsenic ions were implanted, thereby forming an n+type impurity region (FIG. 10(B)).

Figure 10C:
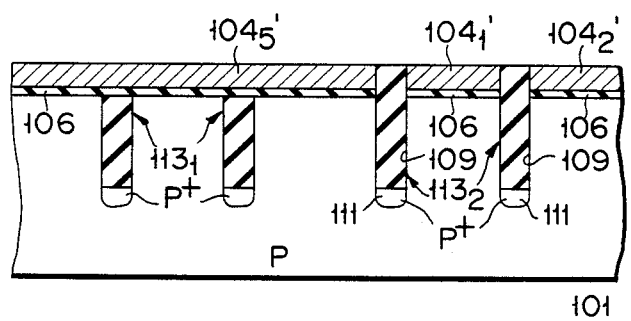
Figure 11:
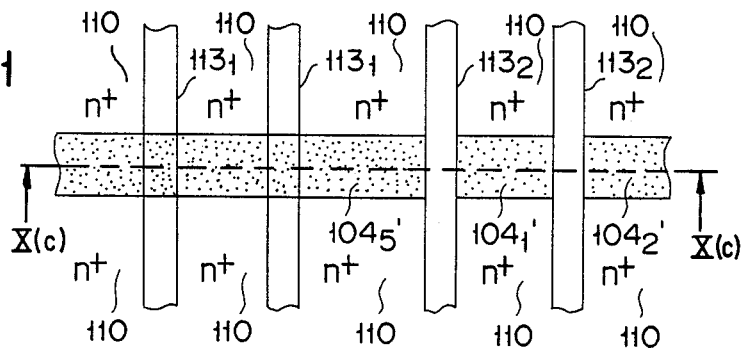
FIG. 11 is a plan view of FIG. 10(C)

Subsequently, with a resist pattern (not shown) as a mask, grooves 109 were formed by selectively etching the pattern 105, the film 105 and the surface layer of the substrate 101. Then, the patterns 105 were isolated, thereby forming a gate electrode $104_5'$ and gate electrodes $104_1'$, $104_2'$ crossing the first film region 113. Thereafter, the grooves 109 were buried with the CVD-SiO$_2$ in the same manner as that in Example 1, thereby forming a second field region $113_2$ (FIG. 10(C) and FIG. 11). FIG. 11 is a plan view of FIG. 10(C).

According to the method in Example 2, an MOSLSI which has gate electrodes $104_5'$ commonly crossing the flat substrate 101 with a plurality of MOS transistors can be provided.

Example 3

Figure 12A:
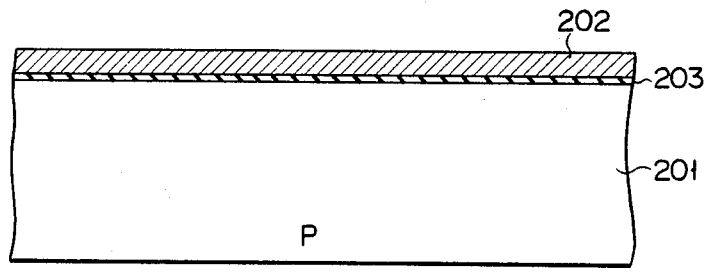
FIGS. 12(A) to 12(D) are sectional views showing the steps up to the formation of the field region in the third embodiment of the present invention.

(i) A p-type silicon substrate 201 having a crystalline plane of (100) was first thermally oxidized, thereby growing a silicon oxidized film (not shown). Then, an arsenic-doped polycrystalline silicon film (not shown) was accumulated thereon. Subsequently, the polycrystalline silicon film was patterned by a photo-etching technique, thereby forming a crystalline silicon pattern 202 as a gate electrode material pattern. With the pattern 202 as a mask the silicon oxidized film was etched, thereby forming a gate oxidized film 203. Thereafter, with the pattern 202 as a mask, arsenic ions were implanted in the substrate 201, thereby activating the substrate, and an n$^+$-type impurity region (not shown) was formed (FIG. 12(A)).

Figure 12B:
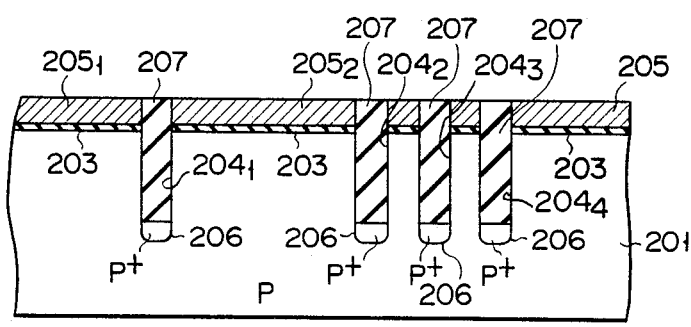

(ii) Subsequently, with the resist pattern (not shown) as a mask, the polycrystalline silicon pattern, the gate oxidized film and the surface layer of the substrate were etched and removed by a reactive ion etching. Thus, a plurality of first grooves $204_1$ to $204_4$ each having side surfaces formed substantially vertically were formed, thereby isolating the polycrystalline silicon patterns and forming gate electrodes $205_1$ to $205_3$. Simultaneously, the n$^+$type impurity regions were isolated, thereby forming n$^+$type source and drain regions (not shown). The grooves $204_2$, $204_3$, $204_4$ of the first grooves $204_1$ to $204_4$ were formed near each other. Subsequently, p$^+$type field inversion preventing regions 206 were formed in the substrate 201 under the firsts grooves $204_1$ to $204_4$ and the grooves $204_1$ to $204_4$ were filled with CVD-SiO$_2$ 207, in the same manner as that in Example 1 (FIG. 12(B)).

Figure 12C:
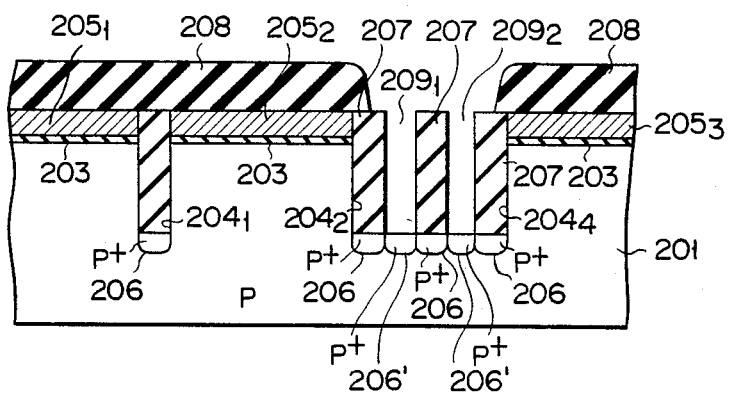

(iii) Then, a photoresist film 208 was positioned to cover the portions except the region between the grooves $204_2$ to $204_4$. Film 208 also covered part of the exposed surface of film 207 at both ends of the first grooves $204_2$ and $204_4$. The portion between grooves $204_2$ and $204_4$ was etched by a reactive ion etching. At this time, as shown in FIG. 12(C), the polycrystalline silicon, the gate oxidized film 203 and the substrate 201 were selectively removed between the grooves $204_2$ and $204_4$ exposed by the film 208, thereby forming two second grooves, $209_1$, $209_2$. Subsequently, with the film 208 as a mask boron ions were implanted in the substrate 201 into the second grooves $209_1$, $209_2$, thereby activating them and forming p$^+$type field inversion preventing regions 206' (FIG. 12(C)).

Figure 12D:
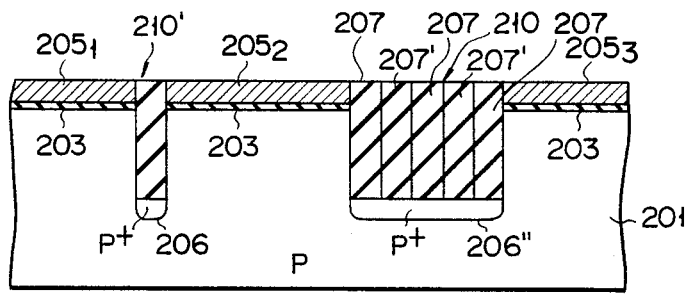

(iv) Subsequently, the film 208 was removed. Then, the second grooves $209_1$, $209_2$ were buried with CVD-SiO$_2$ 207' in the same manner as that in Example 1. Thus, the film 207 remaining in the first grooves $204_2$ to $204_4$ were integrated with the film 207' buried in the second grooves $209_1$, $209_2$, thereby forming a wide field region 210 between the electrodes $205_2$ and $205_3$. The regions 206' under the second grooves $209_1$, $209_2$ were integrated with the regions 206 under the first grooves $204_2$ to $204_4$ by the thermal treatment in the step of burying the film 207', thereby forming a wide p$^+$type field inversion preventing region 206''. Further, the film 207 buried in the groove $204_1$ was utilized as a field region 210' (FIG. 12(D)).

According to the method in Example 3, the electrodes $205_1$ to $205_3$ and the regions 210, 210' can be formed by self-alignment, and the narrow field region 210' and the wide field region 210 can be formed between the gate electrodes.

Example 4

Figure 13A:
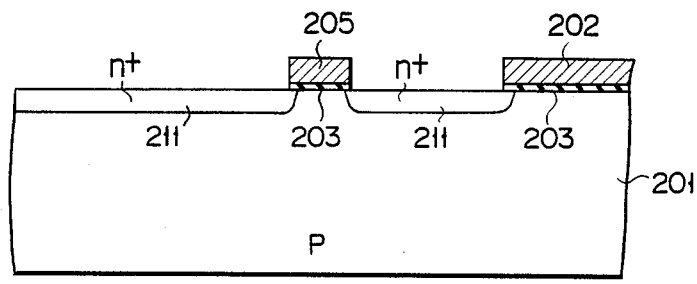
FIGS. 13(A) to 13(D) are sectional views showing the steps up to the formation of the field region in the fourth embodiment of the present invention.

(i) The gate electrode 205 made of an arsenic-doped polycrystalline silicon and the polycrystalline silicon pattern 202 as a gate electrode material pattern were formed on the gate oxidized film 203 on the p-type silicon substrate 201. Then, with the electrode 204 and the pattern 202 as masks, n-type impurity ions such as arsenic ions were implanted, thereby forming n$^+$type impurity regions 211 which become source and drain regions (FIG. 13(A)).

Figure 13B:
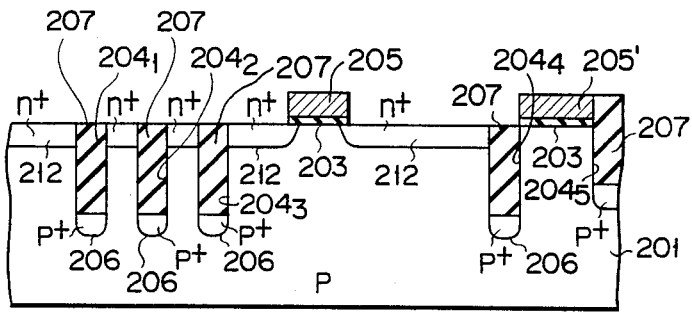

(ii) Subsequently, with a resist pattern (not shown) as a mask the silicon substrate 201 formed with the regions 211, the pattern 202, the film 203 and the surface layer of the substrate 201 were removed by a reactive ion etching. At this time, a plurality of first grooves $204_1$ to $204_5$ each having side surfaces formed substantially vertical to the substrate 201 were formed. The pattern 202 was isolated by the formation of the groove $204_5$, the gate electrode 205' was formed, and the regions 211, were isolated, thereby forming n$^+$type source and drain regions 212. The grooves $204_1$ to $204_3$ of the first grooves $204_1$ to $204_5$ were formed near each other. Subsequently, the regions 206, were formed in the substrate 201 under the grooves $204_1$ to $204_5$ in the same manner as Example 1, and the grooves $204_1$ to $204_5$ were buried with the film 207 (FIG. 13(B)).

Figure 13C:
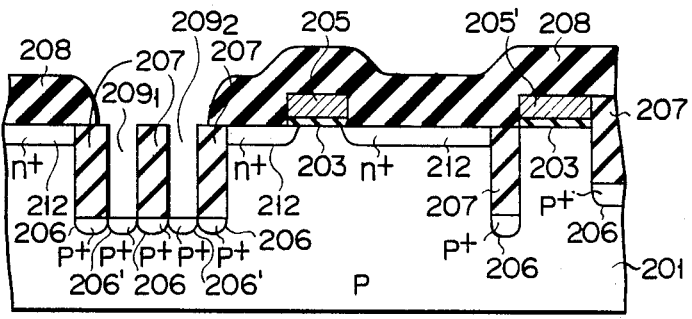

(iii) Then, the photo-resist film 208 was positioned to cover the exposed portions except the region between the $240_1$ and $204_3$. Film 208 also covered part of the exposed surface of film 207 at both ends of the grooves $204_1$ and $204_3$. The portion between grooves $204_1$ and $204_3$ was then etched by a reactive ion etching. The part of the substrate 210 between the grooves $204_1$ and $204_3$ exposed by the film 208 was selectively removed as shown in FIG. 13(C), thereby forming two second grooves $209_1$, $209_2$. Subsequently, with the film 208 as a mask boron ions were implanted in the substrate 201 in the grooves $209_1$, $209_2$, thereby activating it and forming a p$^+$type field inversion preventing region 206' (FIG. 13(C)).

Figure 13D:
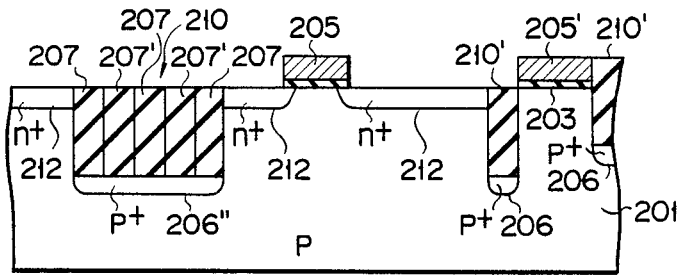

(iv) Subsequently, the film 208 was removed, and the grooves $209_1$, $209_2$ were filled with the film 207' in the same manner as that in Example 1. Thus, the film 207 remaining in the grooves $204_1$ to $204_3$ was integrated with the film 207' buried in the grooves $209_1$, $209_2$, thereby forming a wide field region 210 in the substrate 210. The regions 206 under the grooves $204_1$ to $204_3$ were integrated with the regions 206' under the grooves $209_1$, $209_2$ by the heat treatment in the step of burying the film 207', thereby forming a wide p$^+$type field inversion preventing region 206''. The films 207 buried in the grooves $204_4$, $204_5$ were utilized as the field regions 210', 210' (FIG. 13(D)).

According to the method in Example 4, the electrodes 205' and the region 210' can be self-aligned, and wide and narrow field regions 210 and 210' can be formed at the substrate 201 and between the electrodes.

Example 5

Figure 14A:
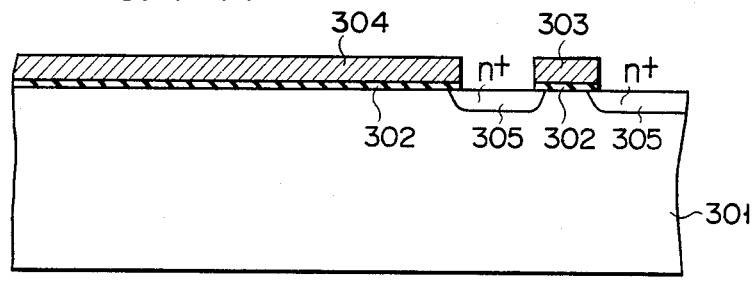
FIGS. 14(A) to 14(D) are sectional views showing the steps up to the formation of the field region in the fifth embodiment of the present invention.

(i) A gate electrode formed of an arsenic-doped polycrystalline silicon and a polycrystalline silicon pattern 304 as a gate electrode material pattern were formed through a gate oxidized film 303 on a p-type silicon substrate 301. Then, with the electrode 303 and the pattern 304 as masks, n-type impurity ions such as arsenic ions were implanted, thereby forming n+type impurity regions 305 which become source and drain regions (FIG. 14(A)).

Figure 14B:
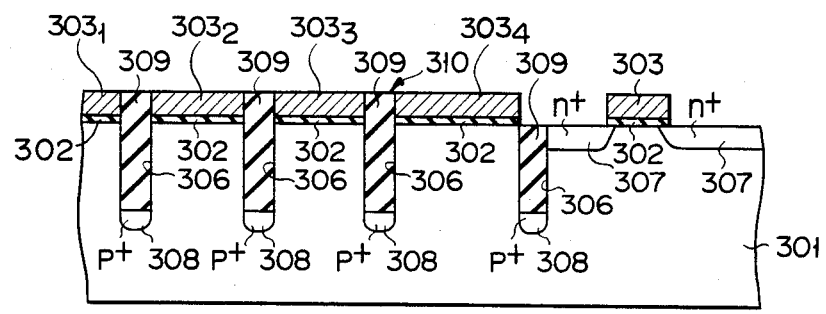

(ii) Then, with a resist pattern (not shown) as a mask, the portions over the pattern 304, the film 302 and the surface layer of the substrate 301 as well as the substrate 301 were etched by reactive ion etching. At this time, grooves 306 each having side surfaces formed substantially vertical and which were connected to each other were formed in the polycrystalline silicon pattern, the gate oxidized film and the surface layer of the substrate. One of the grooves 306 was formed in the substrate 301 in a portion of region 305 as shown in FIG. 14(B). Thus, the patterns 304 were isolated, thereby forming gate electrodes $303_1$ to $303_4$. Simultaneously, the n+type impurity regions were isolated, thereby forming n+type source and drain regions 307. Subsequently, boron ions were implanted in the substrate 301 in the bottoms of the grooves 306, thereby activating them and forming a p+type field inversion preventing region 308. Then, the grooves 306 were filled with $CVD-SiO_2$ 309 in the same manner as Example 1, thereby forming the field region 310 (FIG. 14(B)).

Figure 14C:
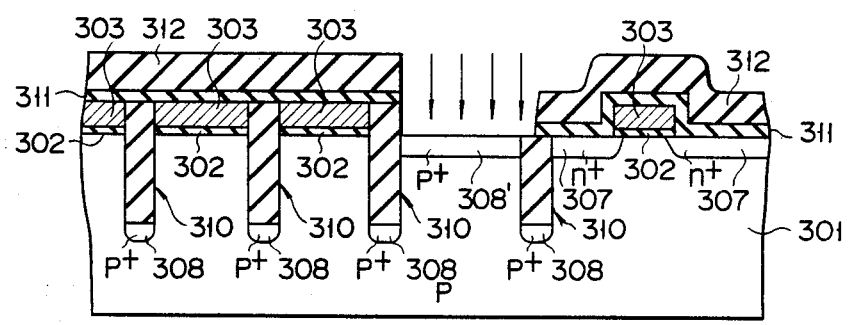

(iii) Subsequently, a silicon nitride film 311 was accumulated on the overall surface. A resist pattern 312, from which the portion corresponding to the electrode $303_4$ was removed, was formed on the film 311. With the pattern 312 as a mask, the film 311 was selectively etched. Then, the electrode 303 and the film 302 under the film 311 were further removed by etching. Subsequently, with the pattern 312 as a mask, boron ions were implanted in the substrate 301, thereby activating it and forming a p+type field inversion preventing region 308' (FIG. 14(C)).

Figure 14D:
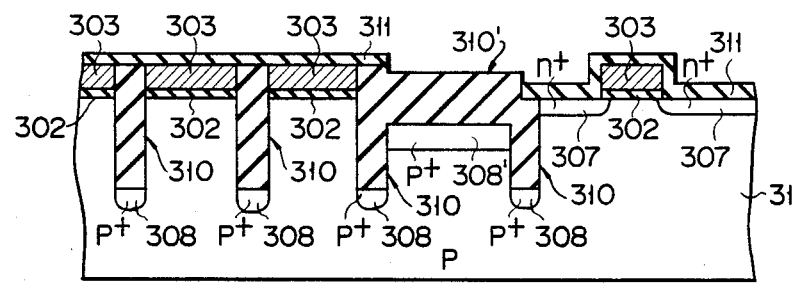

(iv) Then, the pattern 312 was removed, and the film 311 was treated as an oxidation resistant mask in a high temperature oxygen atmosphere, thereby forming a wide field region 310' which was connected to the film 309 of the region 310 (FIG. 14(D)).

According to the method in Example 5, the electrodes $303_1$ to $303_3$ and the field region 310 can be formed by self-alignment, and the wide field region 310' which was connected to the region 310 can be formed on the surface of the substrate 301.

Example 6

Figure 15A:
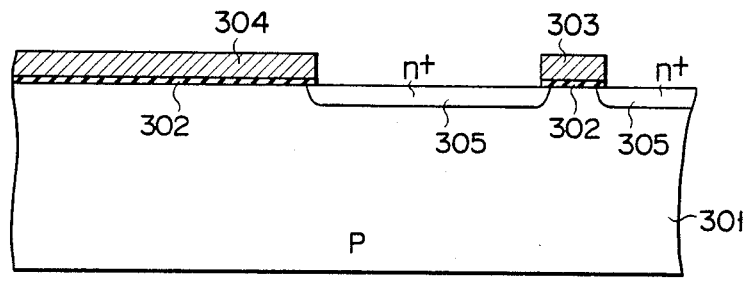

(i) The gate electrode 303 formed of an arsenic-doped polycrystalline silicon and the pattern 304 as a gate electrode material pattern were formed on the film 302 on the substrate 301. Then, with the electrode 303 and the pattern 304 as masks, n-type impurity ions such as arsenic ions were implanted, thereby forming n+type impurity regions 305 which become source and drain regions (FIG. 15(A)).

Figure 15B:
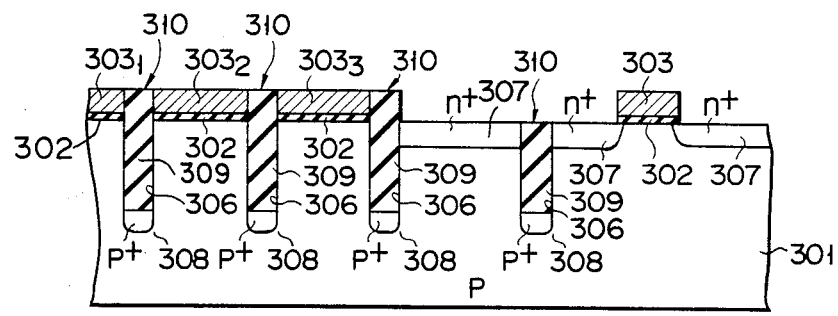

(ii) Subsequently, with the resist pattern (not shown) as the mask, the portions of the pattern 304, the film 302 and the surface layer of the substrate 301 were etched and removed by reactive ion etching. At this time, the grooves 306 each having side surfaces formed substantially vertical and connected to each other were formed, thereby isolating the patterns 304, and forming the electrodes $303_1$ to $303_3$. Simultaneously, the regions 305 were isolated, thereby forming n+type source and drain regions 307. Subsequently, boron ions were implanted to the substrate 301 in the bottom of the grooves 306, thereby activating it and forming the p+type field inversion preventing regions 308. Then, the film 309 was buried in the groove 306 in the same manner as that in Example 1, thereby forming the region 310 (FIG. 15(B)).

Figure 15C:
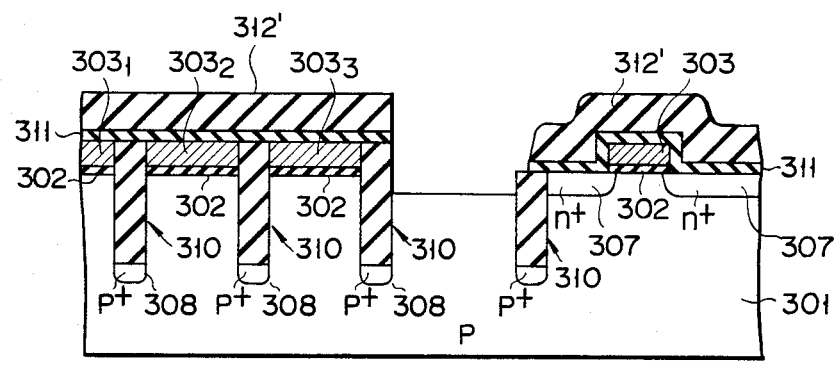
Figures 15D, 15E:
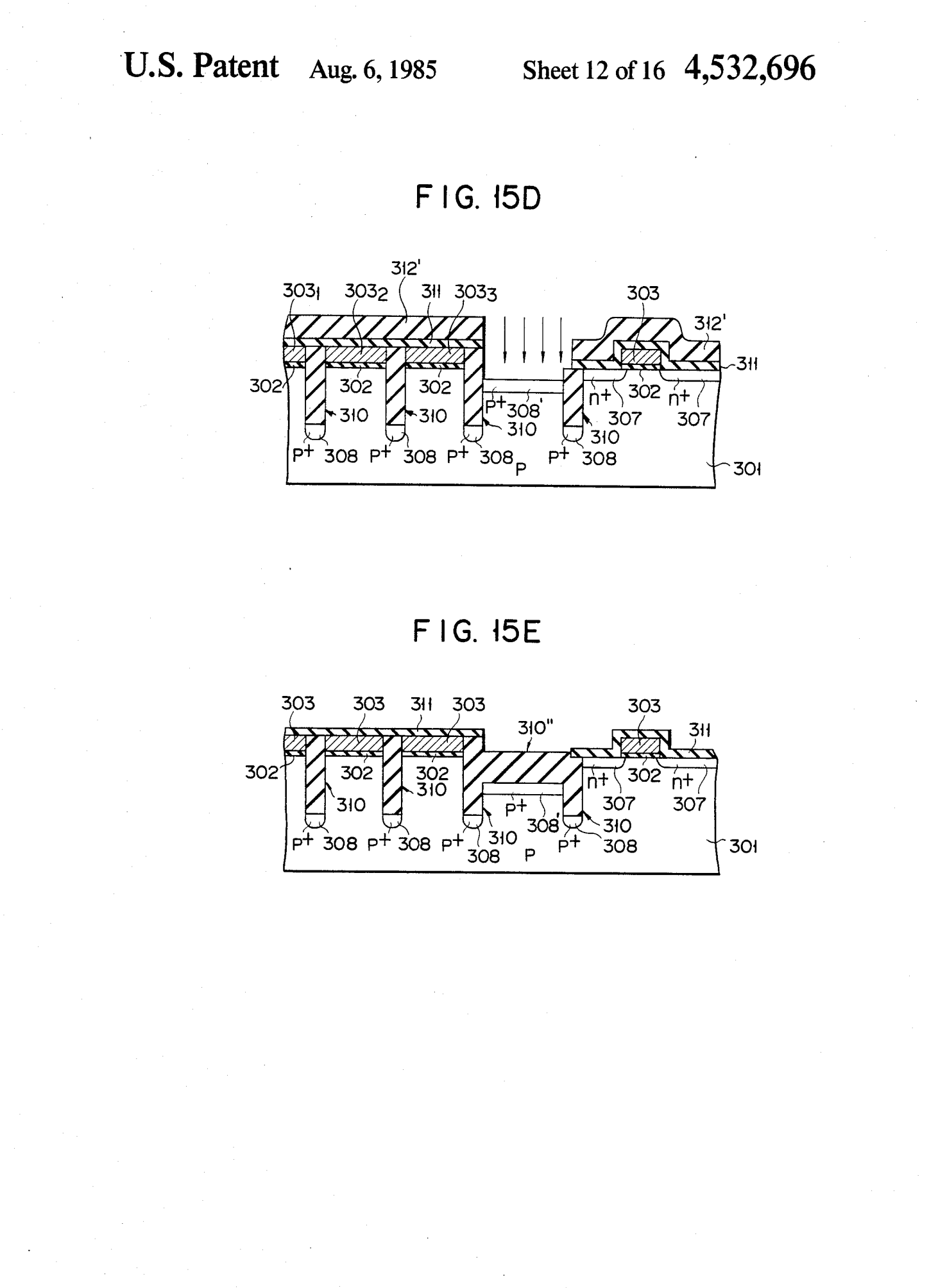

(iii) Then, the film 311 was accumulated on the overall surface, and a resist pattern 312', was formed on the film 311. With the pattern 312' as a mask, the film 311 was selectively etched, and the substrate 301 formed with the source regions (or drain regions) 307 under the film 311 was etched to a predetermined depth (FIG. 15(C)). Subsequently, with the pattern 312' as a mask, boron ions were implanted in the part of the etched substrate 301, thereby forming a p+type field inversion preventing region 308' (FIG. 15(D)).

(iv) Subsequently, the pattern 312' was removed. Then, with the film 311 as an oxidation resistant mask, the film was treated in a high-temperature oxygen atmosphere, thereby forming a wide field region 310'' connected to the film 309 of the region 310 in the substrate 301 (FIG. 15(E)).

According to Example 6, the electrodes $303_1$ to $303_3$ and the region 310 can be self-aligned. The wide field region 310'' which is connected to the region 310, and which is substantially the same level as the surface of the substrate 301, can be formed on the substrate 301.

Example 7

Figure 16A:
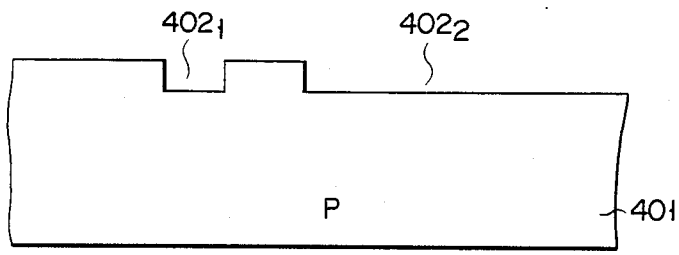
FIGS. 16(A) to 16(E) are sectional views showing the steps up to the formation of the field region in the seventh embodiment of the present invention.
Figure 16B:
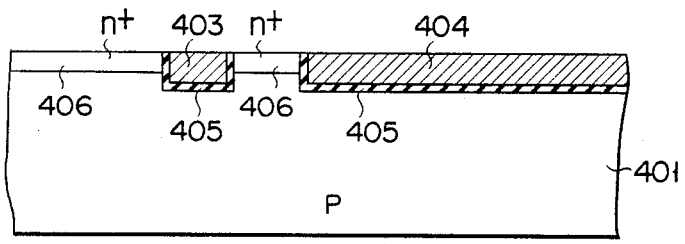

(i) Grooves $402_1$, $402_2$ each having a narrow width were first formed in a p-type silicon substrate 401 so that the extending directions of the grooves become perpendicular to each other (FIG. 16(A)). Subsequently, an oxidized film was grown by thermal oxidation on the surface of the substrate 401 which had grooves $402_1$, $402_2$. Further, an arsenic-doped polycrystalline silicon film was accumulated to sufficiently fill the grooves $402_1$, $402_2$. Subsequently, the polycrystalline silicon film was etched until the oxidized film on the surface of the substrate 401 was exposed, thereby leaving the polycrystalline silicon in the grooves $402_1$, $402_2$. Thus, a gate electrode 403 and a polycrystalline silicon pattern 404 were formed as the gate electrode material pattern in the grooves $402_1$, $402_2$. With the electrode 403 and the pattern 404 as masks, the oxidized film on the substrate 401 was removed, and a gate oxide film 405 was then formed. Thereafter, with the electrode 403 and the pattern 404 as masks n-type impurity ions such as arsenic ions were implanted in the substrate 401, thereby activating it and forming n+type impurity regions 406 which become source and drain regions (FIG. 16(B)).

Figure 16C:
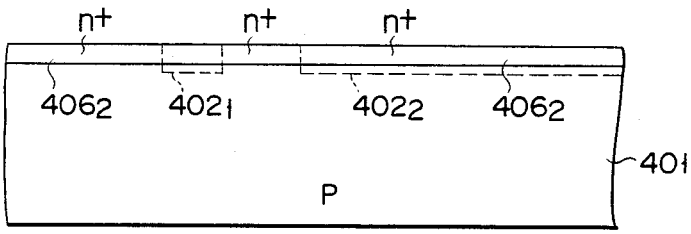

The regions 406 may also be formed by the steps of forming in advance an n+type layer $406_2$ on the overall surface of the substrate 401, as shown in FIG. 16(C), then forming the grooves $402_1$, $402_2$ by etching. Then, growing the oxidized film, accumulating the polycrystalline silicon film and forming the electrode 403 and the pattern 404 by etching as described above.

Figure 16D:
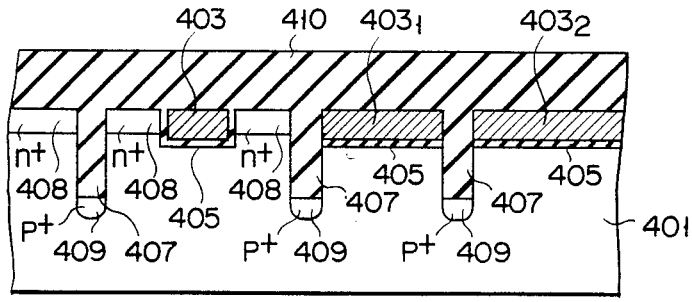

(ii) Subsequently, with a resist pattern (not shown) as a mask, the portions over the substrate 401 formed with the regions 406, the pattern 404, the film 405 and the surface layer of the substrate 401 were selectively etched by a reactive ion etching, and removed. At this time the grooves 407 each have side surfaces formed substantially vertical and connected to each other were formed as shown in FIG. 16(D), thereby isolating the buried polycrystalline silicon pattern 404. Thus, the electrodes $403_1$, $403_2$ were formed, and then n+type impurity regions were also isolated, thereby form $n^{30}$ type source and drain regions 408. Subsequently, boron ions were implanted in the substrate 401 in the bottom of the grooves 407, the substrate 401 was thus activated, thereby forming p+type field inversion preventing region 409. Then, the film 410 was accumulated on the overall surface to sufficiently fill the grooves 407 (FIG. 16(D)).

Figure 16E:
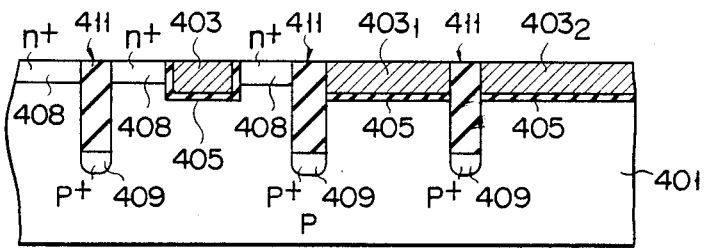

(iii) The film 410 was entirely etched with ammonium fluoride until the substrate 401, except the grooves 407 and the electrodes 403, $403_1$, $403_2$, were exposed. At this time, as shown in FIG. 16(E), CVD-$SiO_2$ remained only in the groove 407, thereby forming strip field regions 411 connected to each other.

According to the method in Example 7, the electrodes $403_1$, $403_2$ and the region 411 can be formed by self-alignment. Further, the electrodes 403, $403_1$, $403_2$ were buried in the substrate 401, and the region 411 was formed at the same level as the surfaces of the electrodes 403, $403_1$, $403_2$. Accordingly, after the formation of the region 411 the surface of the substrate 401 becomes flat. Consequently, when the wires of the source, drain and gates were formed after the accumulation of the interlayer insulating film and the opening of the contacting holes, the stepwise disconnection of the wire caused by the stepwise difference among the electrodes, substrate, field region and the substrate can be prevented.

Figure 17A:
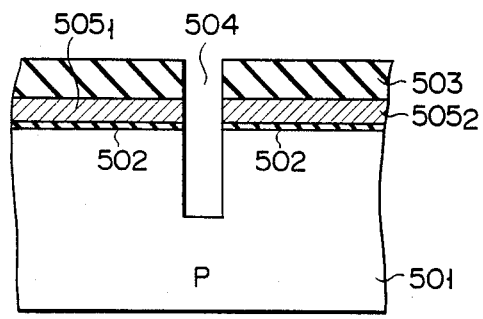
FIGS. 17(A) to 17(D) are sectional views showing the steps up to the formation of the field region in the modified embodiment of the present invention.
Figure 17B:
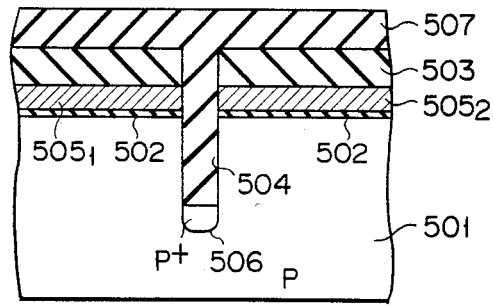
Figure 17C:
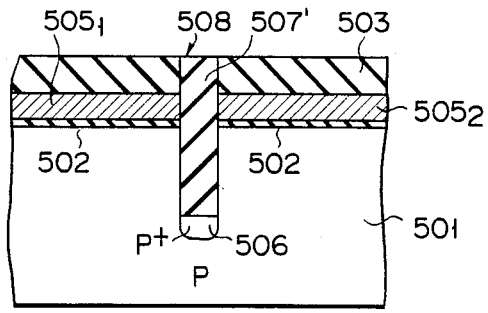

In the Examples described above, the grooves were formed with the resist pattern as a mask. However, with an insulating film as a mask, the grooves may be formed as follows. In other words, as shown in FIG. 17(A), a polycrystalline silicon pattern as a gate electrode material pattern is formed on a gate insulating film 502 on a p-type silicon substrate 501, and an insulating film 503 is opened at portions where grooves are to be formed on the pattern. Then, with the film 503 as a mask, the polycrystalline silicon pattern, the gate insulating film and the surface layer of the substrate 501 were selectively etched, thereby forming grooves 504. Thus, the polycrystalline silicon patterns were isolated, thereby forming gate electrodes $505_1$, $505_2$. Subsequently, a p+type field inversion preventing region 506 was formed on the part of the substrate 501 under the grooves 504. Then, a CVD-$SiO_2$ film 507 was accumulated on the overall surface of the film 503 so as to sufficiently fill the grooves 504 (FIG. 17(B)). Subsequently, the film 507 was etched with ammonium fluoride until the surface of the film 503 was exposed, thereby leaving CVD-$SiO_2$ in the grooves 504, so thereby form the field region 508 (FIG. 17(C)).

Figure 17D:
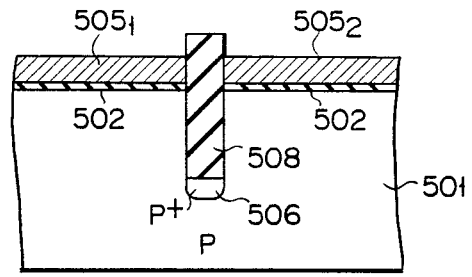

Further, only the film 503 was selectively etched and removed, and the height of the field insulating film 508 may remain higher than the surface of the electrodes $505_1$, $505_2$ or the substrate 501, as shown in FIG. 17(D). The projections of the field insulating film 508 may be advantageous to compensate for the reduction in the thickness of the film in the later step and to complete the insulating effect of the film.

Figure 18:
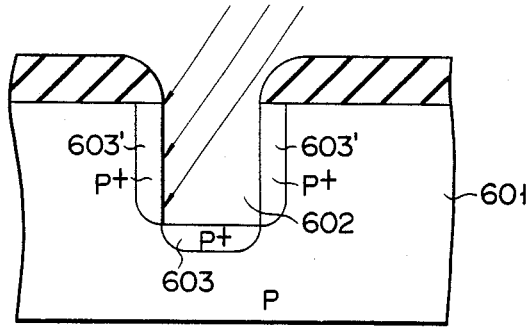
FIG. 18 is a sectional view showing other means for forming a field inversion preventing region in the groove.

In the embodiments described above, the doping of the same conductive type impurity as the substrate was performed by implanting ions substantially vertical to the substrate. However, as shown in FIG. 18, p+type field inversion preventing region 603' may be formed not only on the p+type field inversion preventing region 603 in the bottoms of the grooves 602 of the substrate 601, but also on the side surfaces of the grooves by obliquely implanting the ions, as well.

In the embodiments described above, the grooves were formed vertically or almost vertically to the substrate. However, the grooves need not always be formed like this, but may be formed as follows.

Figure 19A:
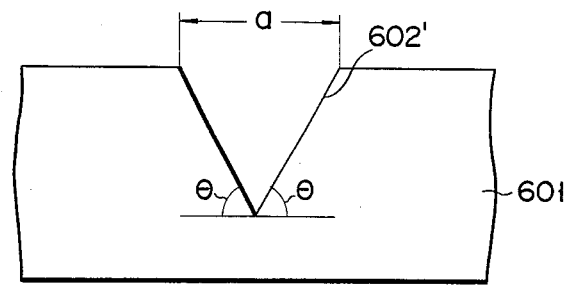
FIGS. 19(A) and 19(B), 20 and 21 are sectional views showing the modified examples of the groove.
Figure 19B:
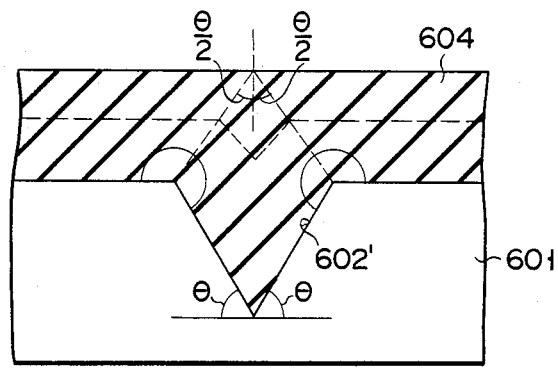

(a) As shown in FIG. 19(a), V-shaped grooves 602' having an oblique angle $\theta$ at the side surfaces may be formed in the substrate 601. At this time, the thickness of the insulating film 604 to be accumulated is determined to be more than $(a \cdot [\cot (\theta/2)]/2)$, where the width of the opening of the groove 602' is represented by a (FIG. 19(B)).

Figure 20:
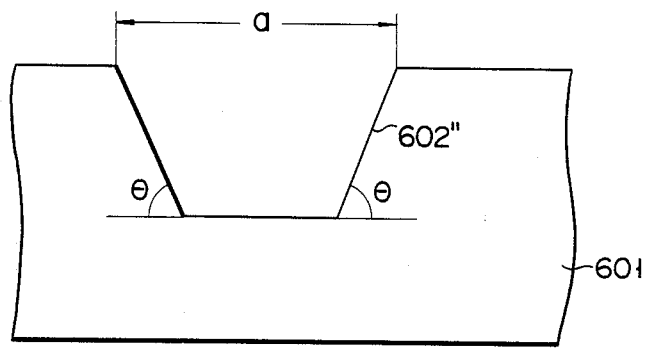

(b) As shown in FIG. 20, the groove 602" having a flat bottom is formed in the substrate 601. At this time, the thickness of the insulating film to be accumulated is determined to $(a \cdot [\cot (\theta/2)]/2)$ in the same manner as the V-shaped groove as described above.

Figure 21:
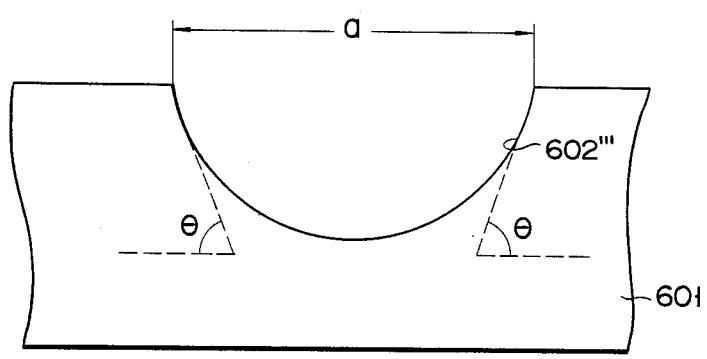

(c) As shown in FIG. 21, the groove 602''' having side surfaces formed of inclined curved surfaces is formed in the substrate 601. At this time, the thickness of the insulating film to be accumulated is determined to $(a \cdot [\cot (\theta/2)]/2)$ in the same manner as described above.

Figure 22:
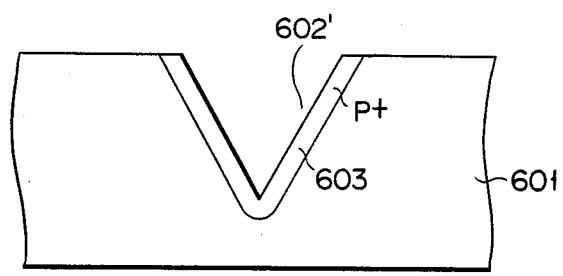
FIG. 22 is a sectional view for the explanatory purpose of the modified embodiment of the present invention.

When the tapered grooves are thus formed, not only the bottom of the groove 602' but the side surfaces of the groove may be simultaneously formed, for example, with a p+type field inversion preventing region 603' by implanting ions vertically from above, as shown in FIG. 22. In FIG. 22, reference numeral 601 designates a semiconductor substrate.

According to the present invention, the production of a defect in the substrate due to the microminiaturization of the field region and the elimination of the thermal oxidation of the semiconductor substrate for a long period of time can be prevented, and a method of manufacturing a semiconductor device which has high integration and high performance can be provided.

What is claimed is:

1. A method of forming a gate electrode of a semiconductor device comprising the steps of:
   forming a gate electrode material pattern on a gate insulating film deposited on a conductive type semiconductor substrate;
   forming a gate electrode by selectively forming grooves in said gate electrode material pattern to thereby isolate said pattern; and
   burying insulating material in said grooves.

2. A method of forming a gate electrode of a semiconductor device comprising the steps of:
   forming a gate electrode material pattern on a gate insulating film deposited on a conductive type semiconductor substrate;
   forming a gate electrode by selectively forming a groove in said gate electrode material pattern; and
   burying insulating material in said groove.

3. The method according to claim 2, wherein another gate electrode is formed on another gate insulating film deposited on part of said semiconductor substrate simultaneously upon formation of said gate electrode material pattern on said substrate.

4. The method according to claim 2, wherein said groove is selectively formed through said gate electrode material pattern and said gate insulating film.

5. The method according to claim 2, wherein said groove is formed through said gate electrode material pattern and said gate insulating film and into the surface of said substrate.

6. The method according to claim 2, wherein said groove comprises vertical or substantially vertical side surfaces.

7. The method according to claim 6, wherein said insulating material is filled in the groove to a thickness larger than the opening width of said groove.

8. The method according to claim 2, wherein after said groove is formed, opposite or same conductivity type impurity as said substrate is doped on the part of said substrate at least in the bottom of said groove before said insulating material is buried in said groove.

9. The method according to claim 2, wherein after said groove is formed, impurity material of the same or opposite conductively type as said substrate is doped opposite or the same conductivity type impurity as said substrate is doped on the side surface of said groove before said insulating material is buried in said groove.

10. The method according to claim 2, wherein the groove comprises a V-shaped section, and a channel stopper layer is formed on the side surfaces of said groove by doping an impurity vertically from above.

11. The method according to claim 2, wherein before said insulating material is buried in said groove, at least part of said groove is oxidized or nitrided, thereby forming an oxidized or nitrided film to a degree which does not block said groove.

12. The method according to claim 11, wherein after said oxidized or nitrided film is formed and before said insulating material is buried in said groove, a conductive material is buried in said groove.

13. The method according to claim 12, wherein said conductive material is polycrystalline silicon.

14. The method according to claim 12, wherein a metal or metal silicide conductive material is buried in the bottom of said groove, and is utilized as a wiring layer.

15. The method according to claim 2, wherein after said insulating material is accumulated during said step of burying to fill said groove, a low temperature melting point substance is doped on the entire or partial surface layer of said insulating material, said insulating material is heat treated to thereby melt the doped layer of said insulating material, thereby flattening the surface of said insulating material, and said insulating material is subsequently etched.

16. The method according to claim 2, wherein after said insulating material is accumulated during said step of burying to fill said groove, a low temperature melting point insulating film is accumulated on the entire or partial surface layer of said insulating material, said insulating film is heated to thereby melt said insulating film, thereby flattening the surface of said insulating film, and said insulating film and insulating layer are subsequently etched.

17. The method according to claim 2, wherein when said insulating material is accumulated during said step of burying to fill said groove and is etched, a masking material is covered on part of said insulating material, and a portion of said insulating material is allowed to remain on said substrate in addition to that in said groove.

18. The method according to claim 2, wherein before said groove is formed, a field insulating film is formed on part of said semiconductor substrate.

19. The method according to claim 2, wherein said groove and said insulating material buried in said groove are used as field regions.

20. The method according to claim 2, wherein after said groove is formed and said insulating material is accumulated during said step of burying to fill said groove, said insulating material is allowed to remain at least in part as an interlayer insulating film on said substrate.

21. The method according to claim 2, wherein said gate electrode material pattern step is performed by first forming another groove in said substrate and them forming said gate electrode material pattern over said another groove.

22. The method according to claim 21, wherein impurity ions are implanted in said substrate adjacent the edges of said groove and the edges of said another groove in regions to become source and drain regions.

23. The method according to claim 21, wherein said another groove is formed after said impurity ions are implanted in said substrate to form source and drain regions.

24. The method according to claim 2, wherein after said gate electrode material pattern is formed, a second insulating material is laminated thereon, an opening is formed in said second insulating material to define the location of said groove, then said groove is formed and said original insulating material is buried in said groove, and thereafter, said original insulating material is etched and removed until the surface of said second insulating material is exposed, then said second insulating material is selectively etched and removed, and said original insulating material is projected from the surface of said substrate where said gate electrode material pattern is formed.

25. The method according to claim 2, wherein said groove comprises an opening having a width "a" and an oblique angle of side surfaces, said insulating material is accumulated during said step of burying to a thickness larger than $(a \cdot [\cot(\theta/2)]/2)$, and said insulating material is etched to allow a portion of said insulating material to remain in said groove.

* * * * *